United States Patent [19]

Gaylord et al.

[11] Patent Number: 4,970,563
[45] Date of Patent: Nov. 13, 1990

[54] SEMICONDUCTOR QUANTUM WELL ELECTRON AND HOLE WAVEGUIDES

[75] Inventors: Thomas K. Gaylord; Kevin F. Brennan; Elias N. Glytsis, all of Atlanta, Ga.

[73] Assignee: Georgia Tech Research Corporation, Atlanta, Ga.

[21] Appl. No.: 374,437

[22] Filed: Jun. 30, 1989

[51] Int. Cl.$^5$ .......................................... H01L 29/161
[52] U.S. Cl. ........................................ 357/016; 357/4; 357/58; 357/30; 350/96.12
[58] Field of Search .................... 357/4, 16, 58, 30 E, 357/30 L; 350/96.12

[56] References Cited

PUBLICATIONS

Timp et al, "Propagation Around a Bend in a Multichannel Electron Waveguide," *Physical Review Letters*, vol. 60, No. 20, May 16, 1988, pp. 2081-2084.
Gaylord et al, "Electron Wave Optics in Semiconductors," *J. Appl. Phys.*, 65 (2), Jan. 15, 1989, pp. 814-820.
Timp et al, "Quantum Transport in an Electron-Wave Guide," *Physical Review Letters*, vol. 59, No. 6, pp. 732-735, Aug. 10, 1987.
Gaylord et al, "Semiconductor Superlattice Electron Wave Interference Filters," *Appl. Phys. Lett.* 53(21), Nov. 21, 1988, pp. 2047-2049.
Heiblum, "Ballistic Electrons and Holes Observed in a Semiconductor," *Optic News*, Oct. 1988, pp. 13—16.
"Quantum Transport in an Electron-Wave Guide", by G. Timp, A. M. Chang, P. Mankiewich, R. Behringer, J. E. Cunningham, T. Y. Chang, and R. E. Howard, *Phys. Rev. Let.*, vol. 59, No. 6, Aug. 10, 1987, pp. 732-735.
"Transmission Line Analogy of Resonance Tunneling Phenomena: The Generalized Impedance Concept", by A. N. Khondker, M. R. Khan and A. F. M. Anwar, *J. Appl. Phys.*, vol. 63, No. 10, May 15, 1988, pp. 5191-5193.
"Propagation Around a Bend in a Multichannel Electron Waveguide" by G. Timp, H. U. Baranger, P. deVegvar, J. E. Cunningham, R. E. Howard, R. Behringer, and P. M. Mankiewich, *Phys. Rev. Let.*, vol. 60, No. 20, May 16, 1988, pp. 2081-2084.
"Ballistic Electrons and Holes Observed in a Semiconductor" by M. Heiblum, *Optics News*, Oct., 1988, pp. 13-16.
Chapter 1, vol. VIII, Quantum Phenomena, by S. Datta, Modular Series on Solid State Devices, Edited by R. F. Pierret and G. W. Neudeck, Addison-Wesley Publishing Company, 1989, pp. 5-37.
"Theory of Quantum Conduction Through a Constriction" by A. Szafer and A. D. Stone, *Phys. Rev. Let.*, vol. 62, No. 3, Jan. 16, 1989, pp. 300-303.
"Electron Wave Optics in Semiconductors" by T. K. Gaylord and K. F. Brennan, *J. Appl. Phys.*, vol. 65, No. 2, Jan. 15, 1989, pp. 814-820.

*Primary Examiner*—William Mintel
*Attorney, Agent, or Firm*—Michael B. Einschlag

[57] ABSTRACT

Semiconductor, quantum well, electron and hole slab waveguides include a substrate semiconductor layer, a film semiconductor layer, and a cover semiconductor layer, wherein the semiconductor layers provide substantially ballistic transport for electrons and wherein the thicknesses and compositions of the semiconductor layers are determined in accordance with the inventive method to provide a waveguide.

17 Claims, 3 Drawing Sheets

SEMICONDUCTOR QUANTUM WELL ELECTRON AND HOLE WAVEGUIDES

This invention was made with Government support under Contract No. DDAL03-87-K-0059 awarded by U.S. Army Research Office. The Government has certain rights in the invention.

BACKGROUND OF THE INVENTION

The present invention pertains to semiconductor quantum well electron and hole waveguides and a method for fabricating them and, in particular, to semiconductor quantum well electron and hole waveguides for ballistic electrons and holes.

Recent progress in semiconductor growth technologies, particularly in molecular beam epitaxy (MBE) and metal organic chemical vapor deposition (MOCVD), enable those of ordinary skill in the art to grow multilayered superlattice structures with precise monolayer compositional control. Further, refinements of these methods have produced improvements in the crystalline quality of materials such as GaAs so that devices have been observed in which ballistic electron transport exists, that is, devices where conduction electrons move through the material without being scattered. Still further, reported experiments have shown that ballistic hole motion also occurs in GaAs, albeit at a lower fraction than that which occurs for electron motion due to the peculiar structure of the valence band of GaAs.

In accordance with a paper entitled "Electron Wave Optics In Semiconductors" by T. K. Gaylord and K. F. Brennan, in *J. Appl. Phys.*, Vol. 65, 1989, at p. 814 and a patent application entitled "Solid State Quantum Mechanical Electron and Hole Wave Devices," Ser. No. 07/272,175, which patent application was filed on Nov. 16, 1988, which patent application is commonly assigned with the present invention, and which patent application is incorporated by reference herein, ballistic electrons are quantum mechanical deBroglie waves which can be refracted, reflected, diffracted, and interferred in a manner which is analogous to the manner in which electromagnetic waves can be refracted, reflected, diffracted, and interferred. Further, phase effects for electron waves, such as path differences and wave interferences, may be described using a wavevector magnitude k given by:

$$k = [2m^*(E-V)]^{\frac{1}{2}}/\hbar \quad (1)$$

where m* is the electron effective mass, E is the total electron energy, V is the electron potential energy, and $\hbar$ is Planck's constant divided by $2\pi$. Still further, amplitude effects for electron waves, such as transmissivity and reflectivity, may be described in terms of an electron wave amplitude refractive index $n_e$(amplitude) which is given by:

$$n_e(\text{amplitude}) \propto [(E-V)/m^*]^{\frac{1}{2}} \quad (2)$$

Using eqn.'s (1) and (2), the characteristics of an unbiased, many boundary semiconductor lattice can be determined in accordance with the material disclosed in the above-cited patent application. In addition to this, however, there is a need in the art for electron and/or hole waveguide devices for use in fabricating analogs of integrated optical devices and the disclosure set forth in the above-cited publication and patent application does not address such electron and/or hole waveguide devices.

SUMMARY OF THE INVENTION

Embodiments of the present invention solve the aboveidentified need in the art by providing semiconductor, quantum well, electron and hole slab waveguides. Specifically, an electron slab waveguide is comprised of a substrate semiconductor layer, a film semiconductor layer, and a cover semiconductor layer, wherein the semiconductor layers provide substantially ballistic transport for electrons and wherein the thicknesses and compositions of the semiconductor layers are determined in accordance with the inventive method which is set forth in detail below to provide a potential well.

In particular, in accordance with the present invention, electron waveguide modes exist for electron energies in the well and for electron energies above one or both of the potential energy barriers of the substrate layer and the conver layer, respectively. Further, in contrast to the behavior of electromagnetic guided waves which only have a lower-energy cutoff due to dispersion, each electron waveguide mode also has an upper-energy cutoff wherein an electron wave is refracted into the substrate layer and/or the cover layer.

Doping of semiconductors is not required for embodiments of the present invention, however, it is preferred that doping not be done within the active region of the device in order to avoid scattering within the materials. This provides a further advantage for the inventive waveguide devices because the absence of doping makes them easier to fabricate.

Note that semiconductor electron slab waveguides can perform as described hereinbelow provided that ballistic transport can be achieved over sufficient distances and that the density of electrons is small enough to make electron-electron interactions negligible.

The inventive electron waveguides should be useful in high-speed electronic circuitry and as a central component in electron guided wave integrated circuits.

BRIEF DESCRIPTION OF THE DRAWING

A complete understanding of the present invention may be gained by considering the following detailed description in conjunction with the accompanying drawing, in which.

DETAILED DESCRIPTION

Figure 1:
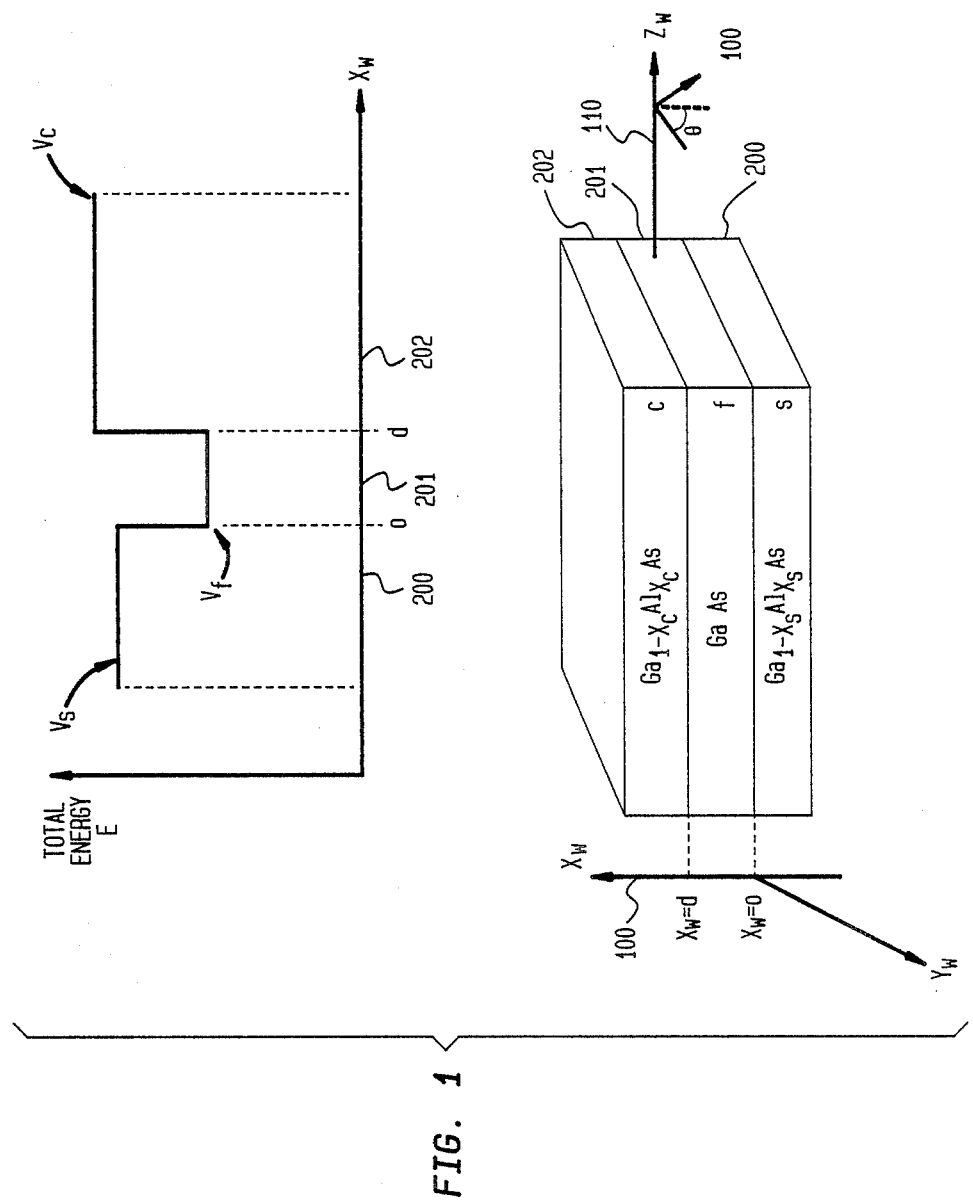
FIG. 1 shows, in pictorial form, the energy level diagram and the material composition of an asymmetric, quantum well slab waveguide fabricated in accordance with the present invention.

FIG. 1 shows, in pictorial form, the energy level diagram and the structure of asymmetric, quantum well slab waveguide 100. We will use the following notation in describing this embodiment of the present invention:

(a) layer 200 will be referred to as substrate layer s, layer 201 will be referred to as film layer f, and layer 202 will be referred to as cover layer c;

(b) the direction perpendicular to the surfaces of waveguide layers 200-202 denoted by arrow 100 will be referred to as $x_w$;

(c) the electron potential energy at the bottom of the quantum well in layer 201, i.e., film layer f, will be referred to as $V_f$;

(d) the electron potential energy barrier heights associated with layer 200, i.e., substrate layer s, and layer 202, i.e., cover layer c, will be referred to as $V_s$ and $V_c$, respectively;

(e) layers 200-202 are comprised of materials from a material system of the type $F_{1-x}G_xH$, and, as a result, we will refer to the compositions of layers 200-202, i.e., substrate layer s, film layer f, and cover layer c, as $x_s$, $x_f$, and $x_c$, respectively;

(f) the direction of guided mode propagation denoted by arrow 110 will be referred to as $z_w$;

(g) the thickness of waveguide layer 201, i.e., film layer f, will be referred to as d;

(h) the angle of incidence of the two plane wave components that constitute an electron guided wave will be referred to as the zig-zag angle $\theta$;

(i) the magnitude of the electron wavevector in any of layers 200-202 is given by $k = [2m^*_i(E-V_i)]^{\frac{1}{2}}/\hbar$, where i=s, f, c for substrate layer s, i.e., layer 200, film layer f, i.e., layer 201, and cover layer c, i.e., layer 202, respectively, and where $m^*_i$ is the electron effective mass, $V_i$ is the electron potential energy, and E is the total electron energy.

In the following description, because layers 200-202 are comprised of materials from the $Ga_{1-x}Al_xAs$ material system, the electron potential energies in layers 200-202 of waveguide 100, i.e., $V_s$, $V_f$, and $V_c$, respectively, are given by the conduction band edge as:

$$V_i = Ax_i \quad i=s, f, c, \tag{3}$$

Further, the electron effective mass in layers 200-202 of waveguide 100 is given by:

$$m^* = (B + Cx_i)m_0 \quad i=s, f, c \tag{4}$$

where $m_0$ is the free electron mass.

Before describing the inventive method for designing specific embodiments of the inventive slab waveguide in detail, we will qualitatively describe the manner in which inventive slab waveguide 100 operates. This will better enable one to understand the inventive method. Further, one can better understand the manner in which inventive slab waveguide 100 operates by understanding the concept of critical angle as it applies to the present invention.

In particular, an equivalent of Snell's law for electron waves, as it relates to inventive slab waveguide 100, is developed by requiring that the component of the electron wavevector which is parallel to a boundary between two layers be the same before and after reflection and refraction, i.e., by requiring that the phase of the transmitted and reflected electron waves along a boundary between two layers be identical to the phase of the incident electron wave. In accordance with this, the onset of total internal reflection occurs when the angle of incidence, i.e., the zig-zag angle defined above, is equal to the critical angle. The critical angle is given by:

$$\theta'_{if} = \sin^{-1}\{[m^*_i(E-V_i)]/[m^*_f(E-V_f)]\}^{\frac{1}{2}} \tag{5}$$

for $V_i < E < E_{if}$ where:

(a) i=s for the critical angle for the boundary between layers 200 and 201, i.e., the boundary between substrate layer s and film layer f;

(b) i=c for the critical angle for the boundary between layers 201 and 202, i.e., the boundary between film layer f and cover layer c; and (c) $E_{if} = (m^*_i V_i - m^*_f V_f)/(m^*_i - m^*_f)$ This is interpreted physically as follows. An electron wave which is incident upon a boundary at an angle which is greater than $\theta'_{if}$ will be totally reflected if the layer on the other side of the boundary is infinitely thick. Thus, at steady state, all of the incident electron current from the film layer which is incident, for example, on an infinitely thick substrate layer or on an infinitely thick cover layer will be reflected back into the film layer. It is interesting to note that if the kinetic energy of an electron wave is less than or equal to 0, i.e., $(E - V_i) \leq 0$, then total internal reflection can occur for any angle of incidence, including normal incidence. This is different from the case of electromagnetic waves where total internal reflection can never occur at normal incidence due to the non-zero value of the refractive index.

Figure 2:
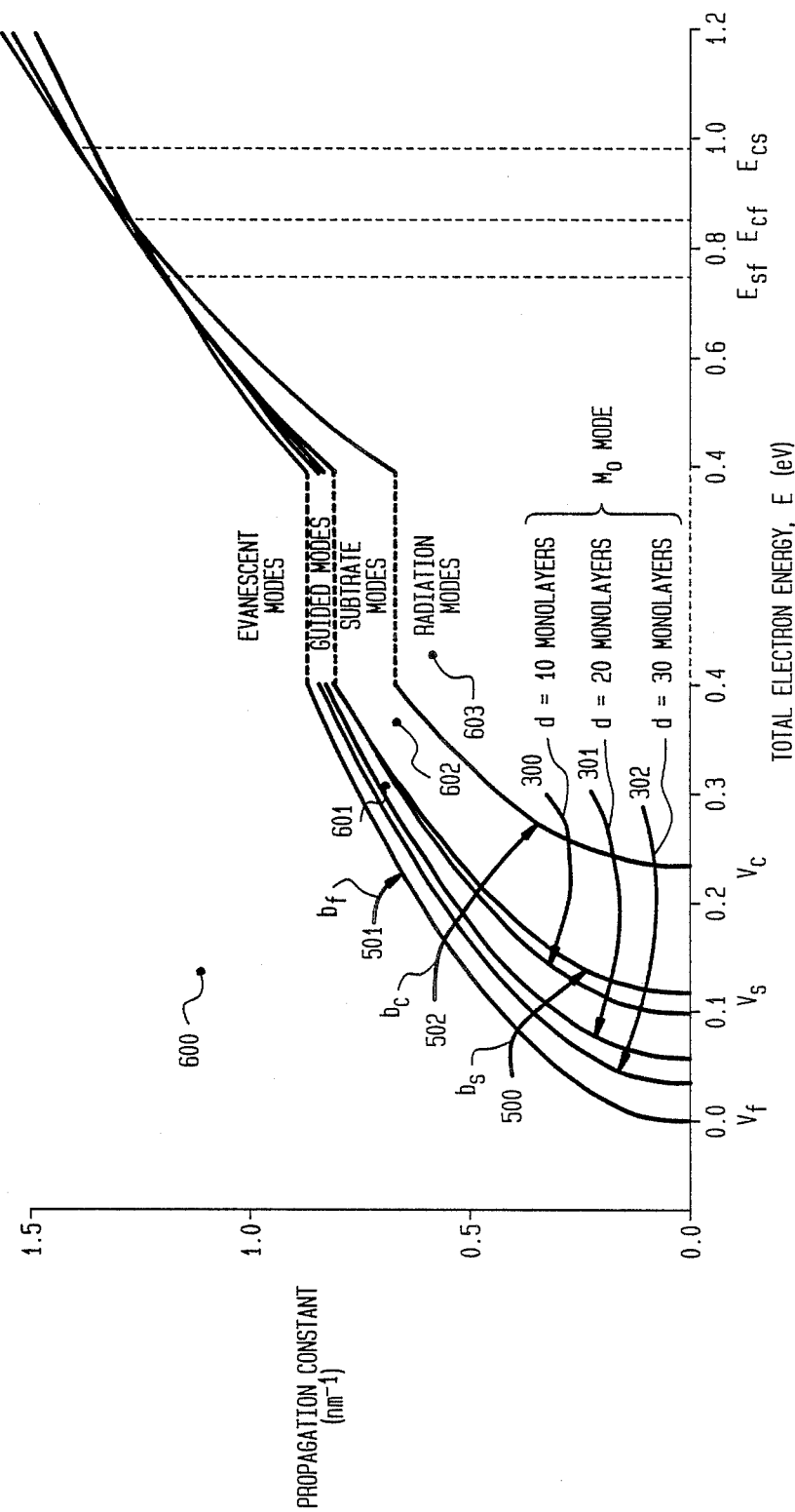
FIG. 2 is a plot of the electron guided mode propagation constant as a function of total electron energy which shows the regions of evanescent modes, guided modes, substrate modes, and radiation modes for a quantum well slab waveguide comprised of a $Ga_{0.85}Al_{0.15}As$ substrate layer, a GaAs film layer, and a $Ga_{0.70}Al_{0.30}As$ cover layer, along with mode dispersion curves for the fundamental mode, $M_o$, for various film layer thicknesses.

FIG. 2 shows, in pictorial form, a plot of electron propagation constant versus total electron energy when substrate layer 200 of slab waveguide 100 is comprised of $Ga_{0.85}Al_{0.15}As$, film layer 201 is comprised of GaAs, and cover layer 202 is comprised of $Ga_{0.70}Al_{0.30}As$. For an infinite medium, the electron propagation constant is defined as follows: $b_i = [2m^*_i(E-V_i)]^{\frac{1}{2}}/\hbar$, where i=s, f, c for substrate layer s, i.e., layer 200, film layer f, i.e., layer 201, and cover layer c, i.e., layer 202, respectively. As shown in FIG. 2: (a) curve 500 is a plot of $b_s$ for substrate layer s, i.e., layer 200; (b) curve 501 is a plot of $b_f$ for film layer f, i.e., layer 201; and (c) curve 502 is a plot of $b_c$ for cover layer c, i.e., layer 202. The interpretation of the information provided by curves 500-502 shown in FIG. 2 is as follows. For a given total electron energy E, the propagation constant of a guided mode can be no larger than $b_f$. As a result of this, region 600 to the left of curve 501 corresponds to evanescent or non-physical modes and the allowed guided modes for this electron waveguide must lie to the right of curve 501. However, an allowed guided mode must satisfy the condition that its zig-zag angle must be greater than the critical angle $\theta'_{cf}$ at the coverfilm boundary and the critical angle $\theta'_{sf}$ at the substrate-film boundary, i.e., the range of zig-zag angle and total energies in FIG. 2 must satisfy the condition that $\theta > \max[\theta'_{cf}, \theta'_{sf}]$. As a result of this, allowed guided modes must lie in region 601 to the left of curve 500.

Next we now will qualitatively discuss cutoff phenomena as they relate to inventive slab waveguide 100. An electron guided wave can become cutoff by decreasing the electron energy and we will refer to the energy at which this cutoff occurs as the lower-energy cutoff. The zig-zag angle of the plane wave component of the electron wave decreases with decreasing energy and lower-energy cutoff occurs when zig-zag angle $\theta=0$. The propagation constant $b_v$ of the $v^{th}$ guided mode, where v is an integer starting at 0, is given by:

$$b_v = [2m^*_f(E-V_f)/\hbar^2]^{\frac{1}{2}} \sin \theta \quad (6)$$

As a result, lower-energy cutoff occurs when $b_v = 0$. At this point, the wavefunction is sinusoidal in film layer f, i.e., layer 201, and exponentially decaying in substrate layer s, i.e., layer 200, and in cover layer c, i.e., layer 202. In this sense, lower-energy cutoff is analogous to the cutoff of an electromagnetic guided mode in a hollow metallic waveguide with finite conductivity walls where the plane wave components of the electromagnetic guided wave are reflecting back and forth at normal incidence to the waveguide boundaries.

As the electron energy of a guided mode is increased, an upper-energy cutoff will also occur. The upper-energy cutoff can be of three types: (1) cutoff to a substrate mode in region 602 of FIG. 2 which is like the cutoff in an electromagnetic asymmetric dielectric waveguide where the substrate index of refraction is higher than the cover index of refraction; (2) cutoff to a radiation mode in region 603 of FIG. 2 which is like the cutoff in an electromagnetic symmetric dielectric waveguide having equal substrate and cover indices of refraction; and (3) cutoff to a cover mode which is like cutoff in an electromagnetic asymmetric dielectric waveguide with the cover index of refraction higher than the substrate index of refraction. The type of upper-energy cutoff which occurs in inventive slab waveguide 100 depends upon the intersection of propagation constants $b_s$, $b_f$, and $b_c$. Specifically, the intersection of $b_f$ and $b_s$ occurs at energy $E_{sf}$ which is given by:

$$E_{sf} = (m^*_s V_s - m^*_f V_f) / (m^*_s - m^*_f) \quad (7)$$

At this energy, the electron wave phase refractive indices for film layer f, i.e., layer 201, and substrate layer s, i.e., layer 200, are equal and, when this energy is reached, inventive slab waveguide 100 can no longer guide an electron wave, even if it is at grazing incidence along the walls of waveguide 100. This energy, $E_{sf}$, is equivalent to substrate-film critical angle $\theta'_{sf} = 90°$.

Similarly, the intersection of $b_f$ and $b_c$ occurs at energy $E_{cf}$ which is given by:

$$E_{cf} = (m^*_c V_c - m^*_f V_f)/(m^*_c - m^*_f) \quad (8)$$

At this energy, the electron wave phase refractive indices for film layer f, i.e., layer 201, and cover layer c, i.e., layer 202, are equal. This energy, $E_{cf}$, is equivalent to cover-film critical angle $\theta'_{cf} = 90°$.

Similarly, the intersection of $b_s$ and $b_c$ occurs at an energy $E_{cs}$ which is given by:

$$E_{cs} = (m^*_c V_c - m^*_s V_s)/(m^*_c - m^*_s) \quad (9)$$

At this energy, the electron wave phase refractive indices for substrate layer s, i.e., layer 200, and cover layer c, i.e., layer 202, are equal.

In general, the type of upper-energy cutoff that occurs depends on the material parameters. In particular, in the embodiment depicted in FIG. 2, upper-energy cutoff will be to a substrate mode because $b_s$, plotted as curve 500, occurs at a lower energy in general that does $b_c$, plotted as curve 502.

In summary, as the electron energy increases for an electron guided mode, zig-zag angle $\theta$ also increases. Further, when the zig-zag angle $\theta$ reaches critical angle $\theta'_{sf}$, the electron guided wave starts to refract into substrate layer s, i.e., layer 200, rather than exponentially decaying therein. Then, for electron energies greater than the energy at which zig-zag angle $\theta$ equals critical angle $\theta'_{sf}$, the electron wave propagates in substrate layer s as well as in film layer f. This condition will be referred to as a substrate mode. Finally, as the electron energy is further increased so that zig-zag angle $\theta$ reaches critical angle $\theta'_{cf}$, the electron wave starts to refract into cover layer c, i.e., layer 202, as well as into substrate layer s. At this point the electron wave is propagating in all three layers, i.e., layers 200-202, and will be referred to as a radiation mode. Further note, that for a different set of material parameters, as the electron energy is increased, it is possible for the electron wave to be refracted into cover layer c and will be referred to as a cover mode.

The following describes the inventive method which is used to determine the thicknesses and compositions for specific embodiments of inventive slab waveguide 100.

In accordance with the patent application entitled "Solid State Quantum Mechanical Electron and Hole Wave Devices," which has been incorporated by reference herein, the magnitude of the electron wavevector and the electron wave phase refractive index $n_e$ (amplitude) of an electron wave in any of layers 200-202 is given by eqns. (1) and (2). Further, the wavefunction for a two-dimensional $(x_w, z_w)$ quantum well guided electron wave has a sinusoidal dependence in the $z_w$ direction and can be expressed as:

$$U_v(x_w, z_w) = U_v(x_w) \exp(jb_v z_w) \quad (10)$$

where $b_v$ is the guided mode propagation constant.

Using eqn. (10), the Schroedinger time independent wave equation becomes:

$$d^2 U_v(x_w)/dx_w^2 + \{(2m^*/\hbar^2)[E_v - V(x_w)] - b_v^2\} U_v(x_w) = 0 \quad (11)$$

Thus, for a guided mode, the wavefunction amplitude in substrate layer s, i.e., layer 200, is given by:

$$U_{vs}(x_w) = A_s \exp(g_s x_w) \quad (12)$$

the wavefunction amplitude in film layer f, i.e., layer 201, is given by:

$$U_{vf}(x_w) = A_{f1} \exp(jk_f x_w) + A_{f2} \exp(-jk_f x_w) \quad (13)$$

and the wavefunction amplitude in cover layer c, i.e., layer 202 is given by:

$$U_{vc}(x_w) = A_c \exp(-g_c(x_w - d)) \quad (14)$$

where:

$$g_c^2 = b_v^2 - [(2m^*_c/\hbar^2)(E_v - V_c)]$$

$$k_f^2 = [(2m^*_f/\hbar^2)(E_v - V_f)] - b_v^2 \quad (15)$$

$$g_s^2 = b_v^2 - [(2m^*_s/\hbar^2)(E_v - V_s)]$$

The dispersion equation for guided modes in film layer f, i.e., layer 201, is determined by using the boundary condition that U and $(1/m^*)$ (dU/dx) are continuous across the cover-film and substrate-film layer boundaries. The dispersion equation for guided modes in film layer f is:

$$k_f d - \tan^{-1}[(g_s/m^*_s)/(k_f/m^*_f)] - \tan^{-1}[(g_c/m^*_c)/(k_f/m^*_f)] = v\pi \quad (16)$$

where v is the integer mode number. Further, we will denote the guided electron waves as $M_v$.

Lower-Energy Cutoff

As discussed above, lower-energy cutoff for guided modes $M_v$ can occur as the electron energy is decreased and guided wave propagation constant $b_v$ goes to zero so that the mode is no longer propagating. FIG. 2 shows that this can occur only for an electron energy below the lower barrier energy of slab waveguide 100, i.e., when $E < V_s$.

The electron energy at which lower-energy cutoff occurs is designated as $E_{Lco}$ and the condition for lower-energy cutoff is determined by substituting $b_v = 0$ into dispersion eqn. (16). As a result, the lower-energy cutoff condition is determined by solving the following transcendental equation for $E_{Lco}$ corresponding to the $M_v$ mode:

$$[2m^*_f(E_{Lco} - V_f)]^{\frac{1}{2}} d/\hbar - \quad (17)$$
$$\tan^{-1}[m^*_f(V_s - E_{Lco})/m^*_s(E_{Lco} - V_f)]^{\frac{1}{2}} -$$
$$\tan^{-1}[m^*_f(V_c - E_{Lco})/m^*_c(E_{Lco} - V_f)]^{\frac{1}{2}} = v\pi$$

Upper-Energy Cutoff

As discussed above, upper-energy cutoff for guided electron waves $M_v$ can occur as the electron energy is increased and total internal reflection no longer occurs, for example, at the substrate-film layer boundary. Thus, as the electron energy is increased through an upper-energy cutoff, the electron wave is refracted into the substrate. That is, as the electron energy is increased through the upper-energy cutoff, the electron wave function amplitude in the substrate changes from being evanescent, i.e., exponentially decaying, to propagating, i.e., sinusoidal. This can only occur for an electron energy above the lower barrier energy of slab waveguide 100, i.e., when $E > V_s$. As a result, the mode "leaks" into the substrate.

The electron energy at which upper-energy cutoff occurs is designated as $E_{Uco}$ and the condition for upper-energy cutoff is determined by substituting $g_s = 0$ into dispersion eqn. (16). As a result, the upper-energy cutoff condition for cutoff to substrate modes is determined by solving the following transcendental equation for $E_{Uco}$ corresponding to the $M_v$ mode:

$$\{2[m^*_s V_s - m^*_f V_f - (m^*_s - m^*_f)E_{Uco}]\}^{\frac{1}{2}} d/\hbar - \tan^{-1}\{A/B\}^{\frac{1}{2}} = v\pi \quad (18)$$

where:

$$A = [m^*_c V_c - m^*_s V_s - (m^*_c - m^*_s)E_{Uco}]m^*_f{}^2$$
$$[m^*_s V_s - m^*_f V_f - (m^*_s - m^*_f)E_{Uco}]m^*_c{}^2$$

Energy of the First Appearance of Modes

For a given set of layer compositions and potential energies, as waveguide thickness d is increased, i.e., thickness d of layer f or layer 201 is increased, a guided mode $M_v$ first starts to propagate at an energy $E = V_s$. This energy corresponds to the highest possible value of cutoff energy for lower-energy cutoff as well as the lowest possible value of cutoff energy for higher-energy cutoff. Substituting $E = V_s$ into dispersion eqn. (16) gives the thickness d at which mode $M_v$ first starts propagating as:

$$d = \{\hbar/2m^*_f(V_s - V_f)]^{\frac{1}{2}}\}$$
$$\{\tan^{-1}[m^*_f(V_c - V_s)/m^*_c(V_s - V_f)]^{\frac{1}{2}} + v\pi\} \quad (19)$$

Also, the range of thicknesses that will produce a waveguide that supports only modes including the $v^{th}$ mode is given by:

$$K_1^*[K_2 + v\pi] < d < K_1^*[K_2 + (v+1)\pi] \quad (20)$$

where:

$$K_1 = \hbar/[2m^*_f(V_s - V_f)]^{\frac{1}{2}}$$
$$K_2 = \tan^{-1}[m^*_f(V_c - V_s)/m^*_c(V_s - V_f)]^{\frac{1}{2}}$$

Thus, one can use eqn. (20) with $v = 0$ to determine the range of thicknesses for layer 201 so that only the lowest mode, i.e., $M_o$, is guided. As one can readily appreciate from this, as with electromagnetic asymmetric dielectric slab waveguides, there is a minimum thickness required for any modes to propagate.

In FIG. 2, curves 300–302 are mode dispersion curves, i.e., plots of propagation constant $b_o$ for the lowest electron guided mode $M_o$ as a function of total electron energy for a specific embodiment of inventive slab waveguide 100. Specifically: (a) layer 200, i.e., substrate layer s, is comprised of $Ga_{0.85}Al_{0.15}As$, i.e., $x_s = 0.15$; (b) layer 201, i.e., film layer f, is comprised of GaAs, i.e., and $x_f = 0$; and (c) layer 202, i.e., cover layer c, is comprised of $Ga_{0.70}Al_{0.30}As$, i.e., $x_c = 0.30$. We have used eqn. (3) with $A = 0.7731$ eV and we have taken the conduction band discontinuity to be approximately 60% of the energy gap change to determine $V_s = 0.115971$ eV for layer 200, $V_f = 0.0000$ eV for layer 201, and $V_c = 0.231942$ eV for layer 202. In addition, we have used eqn. (4) with $B = 0.067$, and $C = 0.083$ to determine $m^*_s = 0.07945 m_o$ for layer 200, $m^*_f = 0.067 m_o$ for layer 201, and $m^*_c = 0.0919 m_o$ for layer 202. In addition, for this embodiment, we have taken layer growth to be along the [100] direction and, as result, each monolayer of material for waveguide 100 has a thickness of 0.28267 nm.

Using eqn. (19), we find that the fundamental mode $M_o$ starts propagating when film layer f has a thickness d of 6 monolayers. Further, again using eqn. (19), we find that the next mode, $M_1$ starts propagating at a thickness of 31 monolayers. As a result, for this embodiment, slab waveguide 100 acts as a single mode waveguide for GaAs layer 201 thicknesses of from 5 to 30 monolayers.

Curves 300–302 shown in FIG. 2 are solutions of dispersion eqn. (16) for $b_o$ as a function of total electron energy for various thicknesses d of film layer f. Specifically: (a) curve 300 corresponds to a film layer f, i.e., layer 201, thickness of 10 monolayers of GaAs, i.e., $d = 2.82665$ nm; (b) curve 301 corresponds to a thickness of 20 monolayers of GaAs, i.e., $d = 5.6533$ nm; and (c) curve 302 corresponds to a thickness of 30 monolayers of GaAs, i.e., $d = 8.47995$ nm.

As one can readily appreciate from FIG. 2, as the thickness of film layer f, i.e., layer 201, is increased, mode dispersion curves 300–302 move to the left and upward. Further, as the thickness d of film layer f increases, the lower-energy cutoff decreases, i.e., curve 301 crosses the energy axis at lower energy than curve 300 does, and the upper-energy cutoff increases, i.e., curve 301 intercepts curve 500 at higher energy than curve 300 does. Note that even at a thickness of 10 monolayers, a guided mode such as $M_o$ can propagate at energies above both potential barriers, i.e., $E>V_s$ and $E>V_c$. This is seen by the fact that curve 300 intersects curve 500 at a point which is at an energy above both $V_c$ and $V_s$.

The energy difference, $\Delta E$, between upper-cutoff energy $E_{Uco}$, i.e., cutoff to a substrate mode, which is determined from eqn. (18) and corresponds to the intersection of an $M_o$ curve 300–302 with curve 500 of FIG. 2, and lower-cutoff energy $E_{Lco}$, i.e., cutoff at $b_v=0$, which is determined from eqn. (17) and corresponds to the intersection of an $M_o$ curve 300–302 with the energy axis, is set forth for the thicknesses of curves 300–302 in Table I.

Symmetric Waveguides

In an embodiment of the inventive slab waveguide 100 which is symmetric, i.e., $V_c=V_s$, substrate and cover dispersion curves $b_s$ and $b_c$ coincide, where substrate dispersion curve $b_s=[2m_s^*(E-V_s)]^{\frac{1}{2}}/\hbar$ and cover dispersion curve $b_c=[2m_c^*(E-V_c)]^{\frac{1}{2}}/\hbar$. In this case, lower-energy cutoff again occurs as the electron energy is decreased and propagation constant $b_v$ goes to zero, i.e., $b_v=0$. This can only occur for an electron energy below the lower barrier energy, i.e., $E<V_s=V_c$. When $b_v=0$, zig-zag angle $\theta$ also equals 0 and the plane wave components of the guided wave are reflected back and forth at normal incidence to the waveguide boundaries.

For a symmetric waveguide, upper-energy cutoff occurs as the energy is increased and the guided mode becomes a radiation mode. At the upper-energy cutoff, total internal reflection occurs neither at the substrate-film boundary nor at the cover-film boundary. The electron wave is then refracted both into substrate layer s, i.e., layer 200, and cover layer c, i.e., layer 202. As the electron energy is increased through upper-energy cutoff, the electron wave function amplitude in substrate layer s, i.e., layer 200, and cover layer c, i.e., layer 202, changes from being evanescent to propagating. This can only occur for an electron energy above the barrier energy, i.e., $E>V_s=V_c$. When $g_s=g_c=0$, the mode leaks into substrate layer s, i.e., layer 200, and cover layer c, i.e., layer 202. This is analogous to the cutoff of an electromagnetic guided mode in a symmetric dielectric slab waveguide. This type of cutoff occurs when the zig-zag angle becomes simultaneously equal to the substrate-film critical angle and the cover-film critical angle.

The first appearance of electron guided wave $M_v$ occurs when the electron energy $E=V_s=V_c$. As a result, electron guided wave $M_v$ first starts propagating as the thickness d of film layer f, i.e., layer 201, is increased to the value:

$$d=v\hbar\pi/[2m^*(V_s-V_f)]^{\frac{1}{2}} \quad (21)$$

Also, from eqn. (20), the range of thicknesses that will produce a waveguide that supports only the lowest order, i.e., $v=0$, mode $M_o$, is obtained from:

$$0<d<c\hbar\pi/[2m^*(V_s-V_f)]^{\frac{1}{2}} \quad (22)$$

As one can appreciate from eqn. (22), symmetric electron slab waveguides are similar to electromagnetic symmetric slab waveguides in that there is no minimum thickness required for the lowest-order mode to propagate, i.e., any thickness will support the $M_o$ mode. However, for very thin electron slab waveguides, the exponentially decaying tails of the wavefunction may extend very far into the substrate and cover layers.

Figure 3:
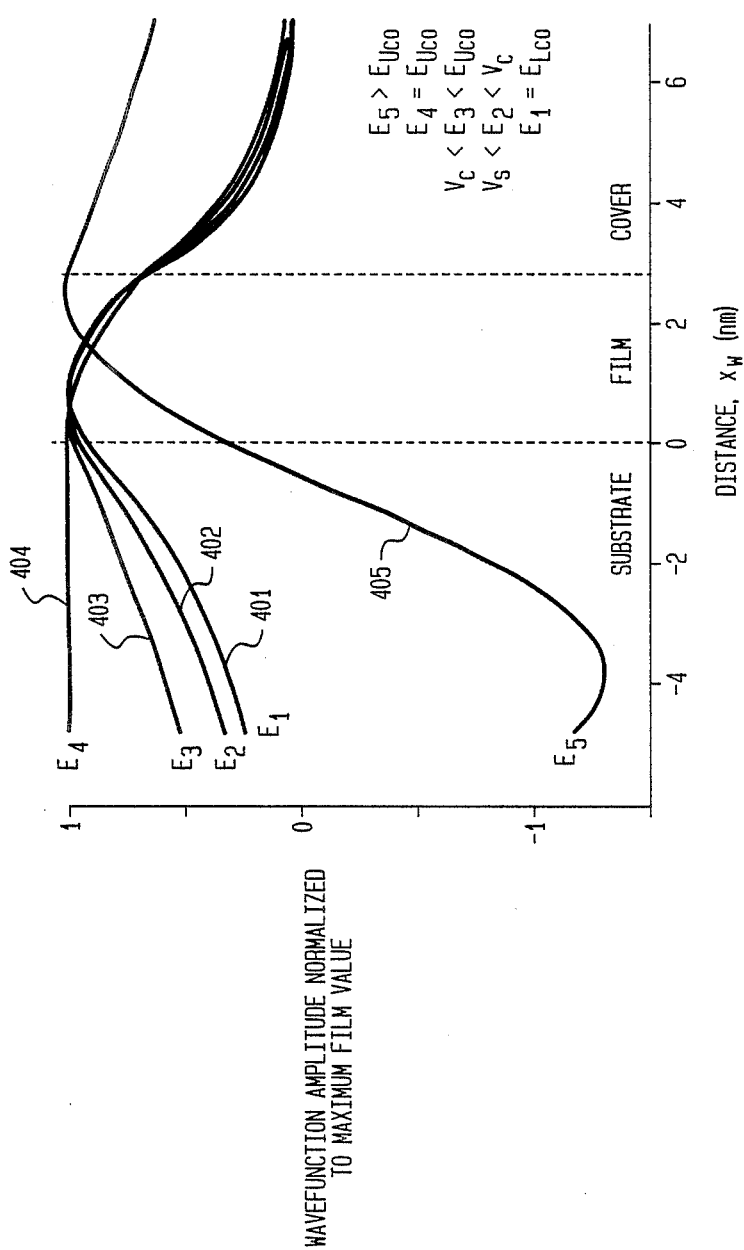
FIG. 3 is a plot of the wavefunction $U_v$ for the $M_o$ mode of a slab waveguide comprised of the GaAlAs material system having a 10 monolayer thick GaAs film layer for various electron energies. To facilitate understanding, identical reference numerals are used to designate elements common to the figures.

FIG. 3 shows, in pictorial form, wavefunction $U_v$ for the $M_o$ mode for a 10 monolayer thick GaAs film layer f, i.e., layer 201, for various electron energies: (a) curve 401 corresponds to electron energy $E_1=E_{Lco}$ with $b=0$ cutoff; (b) corresponds to electron energy $V_s<E_2<V_c$; (c) corresponds to electron energy $V_c<E_3<E_{Uco}$; (d) corresponds to electron energy $E_4=E_{Uco}$; and (e) corresponds to electron energy $E_5>E_{Uco}$. Curves 401–404 illustrate guided mode behavior in those ranges of electron energy and curve 405 shows the wavefunction for an energy above upper-cutoff energy to illustrate substrate mode behavior.

Clearly, those skilled in the art recognize that further embodiments of the present invention may be made without departing from its teachings. For example, it is within the spirit of the present invention to provide a hole slab waveguide as well an electron slab waveguide.

In terms of nomenclature, it should be clear to those of ordinary skill in the art that references to electron energies being above the potential barriers, correspond to energies, as shown in FIG. 1, which are above the conduction band. Further, it should also be clear to those of ordinary skill in the art that similar references for holes correspond to energies which are below the valence band.

Further, it well known to those of ordinary skill in the art as to how electrons and/or holes may be injected into the film layer of a slab waveguide.

Still further, it should be clear to those of ordinary skill in the art that embodiments of the present invention may be fabricated wherein the film layer is comprised of a substantially ballistic material whereas the substrate layer and/or the cover layer are not so comprised. However, in such embodiments it would be advantageous for the doping of the substrate layer and/or the cover layer to be small enough so that excessive loss in these layers is not caused thereby.

Yet still further, it should be clear to those of ordinary skill in the art that the thickness of the substrate layer and the thickness of the cover layer may have substantially any value. In practice, however, the thicknesses of these layers should be large enough to support the exponential tails of guided waves in the film layer. Such a thickness are typically much less than the thickness of the film layer and, in general, will be a few monolayers of the material of which the substrate layer and/or the cover layer is comprised. In practice, the thickness of the substrate layer is of no concern because the substrate layer is typically much thicker than layers which are grown or deposited thereon. Physically, these requirements may be understood as defining a requirement that the guided wave in the film layer not "sense" the presence of a boundary at, for example, the top of the cover layer.

Lastly, it should be clear to those of ordinary skill in the art that appropriate solid state materials for use in fabricating embodiments of the present invention include semiconductor materials such as, without limitation, binary, ternary and quaternary compositions of, among others, III-V elements and II-VI elements.

TABLE I

Upper- and Lower-Cutoff Energies and Range of Energies for the Lowest-Order Waveguide Mode, $M_o$, for Various Film Thicknesses in a $Ga_{0.85}Al_{0.15}As$ substrate, GaAs film, $Ga_{0.70}Al_{0.30}As$ cover Quantum Well Waveguide

|  | Waveguide Film Thickness (GaAs) | | |
|---|---|---|---|
| d (nm) | 2.8267 | 5.6533 | 8.4800 |
| d (monolayers) | 10 | 20 | 30 |
| Upper Cutoff Energy, $E_{Uco}$ (eV) | 0.4979 | 0.6536 | 0.6926 |
| Lower Cutoff Energy, $E_{Lco}$ (eV) | 0.0973 | 0.0551 | 0.0341 |
| Propagation Energy Range, E (eV) | 0.4006 | 0.5985 | 0.6585 |

What is claimed is:

1. An electron waveguide which comprises:
a substrate layer comprised of semiconductor material having a potential energy barrier and an electron effective mass;
a film layer comprised of semiconductor material having a potential energy barrier and an electron effective mass adjacent to the substrate layer; and
a cover layer comprised of semiconductor material having a potential energy barrier and an electron effective mass adjacent to the film layer;
wherein at least a portion of the substrate layer which is adjacent to the film layer, the film layer, and at least a portion of the cover layer adjacent to the film layer provide substantially ballistic transport for electrons; and
wherein a thickness of the film layer and the potential energy barriers and electron effective masses of the substrate, film, and cover layers are predetermined to provide a potential well so that electron waveguide modes exist for electron energies in the well.

2. The electron waveguide of claim 1 wherein the electron potential energy barrier for the cover layer and the substrate layer are substantially the same height.

3. The electron waveguide of claim 2 wherein the cover layer and the substrate layer are comprised of the same material.

4. The electron waveguide of claim 1 wherein the cover layer, the film layer, and the substrate layer are fabricated from semiconductor compositions of the form $Ga_{1-x}Al_xAs$.

5. The electron waveguide of claim 4 wherein the film layer is comprised of GaAs.

6. The electron waveguide of claim 1 wherein:
(a) the heights of the electron potential energy barrier of the cover layer, the film layer and the substrate layer of the electron waveguide are $V_c$, $V_f$ and $V_s$, respectively; and
(b) the thickness d of the film layer is predetermined so that at least the $v^{th}$ electron waveguide mode propagates, where v is an integer; d being substantially equal to or greater than:

$$d = \{\hbar/[2m^*_f(V_s - V_f)]^{\frac{1}{2}}\} * \{\tan^{-1}[m^*_f(V_c - V_s)/m^*_c(V_s - V_f)]^{\frac{1}{2}} + v\pi\}$$

wherein $m^*_c$, $m^*_f$ and $m^*_s$ are the electron effective masses in the cover layer, the film layer, and the substrate layer, respectively, and is Planck's constant divided by $2\pi$.

7. The electron waveguide of claim 6 wherein the waveguide only supports modes no higher than the $v^{th}$ mode wherein:

$$K_1*[K_2 + v\pi] < d < K_1*[K_2 + (v+1)\pi]$$

where:

$$K_1 = \hbar/[2m^*_f(V_s - V_f)]^{\frac{1}{2}}$$

$$K_2 = \tan^{-1}[m^*_f(V_c - V_s)/m^*_c(V_s - V_f)]^{\frac{1}{2}}$$

8. The electron waveguide of claim 2 wherein:
(a) the heights of the electron potential energy barrier of the cover layer, the film layer and the substrate layer are $V_c$, $V_f$ and $V_s$, respectively; and
(b) the thickness d of the film layer is predetermined so that at least the $v^{th}$ electron waveguide mode propagates, where v is an integer; d being substantially equal to or greater than:

$$d = v\hbar\pi/[2m^*_f(V_s - V_f)]^{\frac{1}{2}}$$

wherein $m^*_c$, $m^*_f$ and $m^*_s$ are the electron effective masses in the cover layer, the film layer, and the substrate layer, respectively, and h is Planck's constant divided by $2\pi$.

9. The electron waveguide of claim 8 wherein the waveguide only supports the lowest order mode, i.e., v=0, wherein:

$$0 < d < \hbar\pi/[2m^*_f(V_s - V_f)]^{\frac{1}{2}}$$

10. The electron waveguide of claim 1 wherein the semiconductor materials which comprise at least one of the substrate, film, and cover layers are binary, ternary or quaternary semiconductor compositions of III-V elements.

11. An electron waveguide which comprises:
a substrate layer comprised of a semiconductor material having a potential energy barrier and an electron effective mass;
a film layer comprised of a semiconductor material having a potential energy barrier and an electron effective mass adjacent the substrate layer; and
a cover layer comprised of a semiconductor material having a potential energy barrier and an electron effective mass adjacent the film layer;
wherein the film layer provides substantially ballistic transport for electrons; and
wherein a thickness of the film layer and the potential energy barriers and electron effective masses of the substrate, film, and cover layers are predetermined to provide a potential well so that electron waveguide modes exist for electron energies in the well.

12. A hole waveguide which comprises:
a substrate layer comprised of a semiconductor material having a potential energy barrier and a hole effective mass;
a film layer comprised of a semiconductor material having a potential energy barrier and a hole effective mass adjacent the substrate layer; and
a cover layer comprised of a semiconductor material having a potential energy barrier and a hole effective mass adjacent the film layer;
wherein at least a portion of the substrate layer which is adjacent the film layer, the film layer, and at least a portion of the cover layer adjacent the film layer provide substantially ballistic transport for holes; and wherein a thickness of the film layer and the potential energy barriers and hole effective masses of the substrate, film, and cover layers are predetermined to provide a potential well so that hole waveguide modes exist for hole energies in the well 13. An electron waveguide which comprises:

a substrate layer comprised of semiconductor material having a potential energy barrier and an electron effective mass;

a film layer comprised of semiconductor material having a potential energy barrier and an electron effective mass adjacent to the substrate layer; and a cover layer comprised of semiconductor material having a potential energy barrier and an electron effective mass adjacent to the film layer;

wherein at least a portion of the substrate layer which is adjacent to the film layer, the film layer, and at least a portion of the cover layer adjacent to the film layer provide substantially ballistic transport for electrons; and wherein a thickness of the film layer and the potential energy barriers and electron effective masses of the substrate, film, and cover layers are predetermined to provide a potential well so that electron waveguide modes exist for electron energies above the potential energy barrier of at least one of the substrate and cover layers.

14. The electron waveguide of claim 1, wherein the semiconductor materials which comprise at least one of the substrate, film, and cover layers are one of binary, ternary an quaternary semiconductor compositions of II-VI elements.

15. An electron waveguide which comprises:

a substrate layer comprised of a semiconductor material having a potential energy barrier and an electron effective mass;

a film layer comprised of a semiconductor material having a potential energy barrier and an electron effective mass adjacent the substrate layer; and a cover layer comprised of a semiconductor material having a potential energy barrier and an electron effective mass adjacent the film layer;

wherein the film layer provides substantially ballistic transport for electrons; and wherein a thickness of the film layer and the potential energy barriers and electron effective masses of the substrate, film, and cover layers are predetermined to provide a potential well so that electron waveguide modes exist for electron energies above the potential energy barrier of at least one of the substrate and cover layers.

16. A hole waveguide which comprises:

a substrate layer comprised of a semiconductor material having a potential energy barrier and a hole effective mass;

a film layer comprised of a semiconductor material having a potential energy barrier and a hole effective mass adjacent the substrate layer; and a cover layer comprised of a semiconductor material having a potential energy barrier and a hole effective mass adjacent the film layer;

wherein at least a portion of the substrate layer which is adjacent the film layer, the film layer, and at least a portion of the cover layer adjacent the film layer provide substantially ballistic transport for holes; and wherein a thickness of the film layer and the potential energy barriers and hole effective masses of the substrate, film, and cover layers are predetermined to provide a potential well so that hole waveguide modes exist for hole energies above the potential energy barrier of at least one of the substrate and cover layers.

17. The electron waveguide of claim 13 wherein the electron potential energy barrier for the cover layer and the substrate layer are substantially the same height.

* * * * *

UNITED STATES PATENT AND TRADEMARK OFFICE
CERTIFICATE OF CORRECTION

PATENT NO. : 4,970,563

DATED : November 13, 1990

INVENTOR(S) : Thomas K. Gaylord, et al.

It is certified that error appears in the above-indentified patent and that said Letters Patent is hereby corrected as shown below:

Column 1 line 5 "DDAL03-87-K-0059" should be "DAAL-03-87-K-0059"
line 44 "interferred" should be "interfered"
Eqn. (1) "$\not{h}$" should be "$\hbar$"
line 53 "$\not{h}$" should be "$\hbar$"

Column 2 line 6 "aboveidentified" should be "above identified"
line 22 "conver" should be "cover"
line 59 "85" should be a subscript

Column 3 line 33 "by k -" should be "by $k_i$ -"
Eqn. (3) "i - s,f,c," should not be subscripted.

Column 4 line 57 "coverfilm" should be "cover-film"

UNITED STATES PATENT AND TRADEMARK OFFICE
CERTIFICATE OF CORRECTION

PATENT NO. : 4,970,563       Page 2 of 4
DATED : November 13, 1990
INVENTOR(S) : Thomas K. Gaylord, et al It is certified that error appears in the above-indentified patent and that said Letters Patent is hereby corrected as shown below:

Column 5 line 3  "$b_\nu$" should be "$\beta_\nu$" (Change b to lower case beta)
line 3  "$v^{th}$" should be "$\nu^{th}$"
line 4  "v" should be "$\nu$"
Eqn. (6)  "$b_\nu$" should be "$\beta_\nu$" (Change b to lower case beta)
line 8  "$b_\nu$-0" should be "$\beta_\nu$-0"
Eqn. (7)  "$m^*_s V_s - m^*_f$" should be "$m^*_s V_s - m^*_f V_f$"
line 45  "-" should not be a subscript
line 54  "-" should not be a subscript
line 67  "in general that does" should be "in general than does"

Column 6 line 29  "wave phase refractive index $n_e$(amplitude)" should be "wave amplitude refractive index $n_e$(amplitude)"
line 39  "egn." should be "eqn."
line 39  "time independent" should be "time-independent"
Eqn. (11)  "$\not{h}$" should be "$\hbar$"
Eqn. (15)  "$\not{h}$" should be "$\hbar$"
Eqn. (15)  ")]" should not be subscripted

Column 7

Eqn. (16)  "$m^*_f)$-" should be "$m^*_f)$] -"
line 9  "v" should be "$\nu$"
line 10  "$M_v$" should be "$M_\nu$"
Eqn. (18)  "$[m^*_s V_s$" should be "B - $[m^*_s V_s$"

Column 8

Eqn. (19)  "$(\hbar/2m^*_f$" should be "$(\hbar/[2m^*_f$"
line 11  "v" should be "$\nu$"
Eqn. (20)  "$K_1^*$" should be "$K_1$"
Eqn. (20)  "$K_2^-$" should be "$K_2$"
line 20  "v" should be "$\nu$"

UNITED STATES PATENT AND TRADEMARK OFFICE
CERTIFICATE OF CORRECTION

PATENT NO. : 4,970,563  Page 3 of 4
DATED : November 13, 1990
INVENTOR(S) : Thomas K. Gaylord, et al It is certified that error appears in the above-indentified patent and that said Letters Patent is hereby corrected as shown below:

Column 9

Eqn. (19) Add * after first line of equation.
line 20  "v" should be "$\nu$"
line 42  "wave function" should be "wavefunction"
Eqn. (22) "$c\hbar\pi$" should be "$\hbar\pi$"
line 64  "v" should be "$\nu$"

Column 10 line 24  "as well an electron" should be "as well as an electron"
line 33  "it well known" should be "it is well known"
line 52  "Such a thickness" should be "Such thicknesses"

Column 11 line 58  "v" should be "$\nu$"
line 59  "v" should be "$\nu$"
line 61 (eqn.)  "$d = \{\hbar/2m^*_f$" should be "$d = \{\hbar/[2m^*_f$"
line 61 (eqn.)  Divide equation at * rather than after tan.
line 67  "and is Planck's" should be "and $\hbar$ is Planck's"

Column 12 line 2  "v" should be "$\nu$"
line 5 (eqn.) "$K_1^*$" should be "$K_1$"
line 11  Move $K_2$ equation up by one line.
line 17  "v" should be "$\nu$"
line 18  "v" should be "$\nu$"
line 25  "h" should be "$\hbar$"
line 29  "v" should be "$\nu$"

UNITED STATES PATENT AND TRADEMARK OFFICE
CERTIFICATE OF CORRECTION

PATENT NO. : 4,970,563
DATED : November 13, 1990
INVENTOR(S) : Thomas K. Gaylord, et al.

It is certified that error appears in the above-indentified patent and that said Letters Patent is hereby corrected as shown below:

Column 13, line 6, "in the well" should be --in the well.--

Signed and Sealed this

First Day of March, 1994

Attest:

BRUCE LEHMAN

Attesting Officer

Commissioner of Patents and Trademarks